(12) United States Patent
Xu

(10) Patent No.: US 9,461,072 B2
(45) Date of Patent: Oct. 4, 2016

(54) LIQUID CRYSTAL DISPLAY ARRAY SUBSTRATES AND A METHOD FOR MANUFACTURING THE SAME

(71) Applicant: SHENZHEN CHINA STAR OPTOELECTRONICS TECHNOLOGY CO., LTD., Shenzhen, Guangdong (CN)

(72) Inventor: Xiangyang Xu, Shenzhen (CN)

(73) Assignee: SHENZHEN CHINA STAR OPTOELECTRONICS TECHNOLOGY CO., LTD., Shenzhen (CN)

(*) Notice: Subject to any disclaimer, the term of this patent is extended or adjusted under 35 U.S.C. 154(b) by 0 days.

(21) Appl. No.: 14/240,370

(22) PCT Filed: Jan. 17, 2014

(86) PCT No.: PCT/CN2014/070762
§ 371 (c)(1),
(2) Date: Feb. 22, 2014

(87) PCT Pub. No.: WO2015/096236
PCT Pub. Date: Jul. 2, 2015

(65) Prior Publication Data
US 2015/0179677 A1    Jun. 25, 2015

(30) Foreign Application Priority Data
Dec. 25, 2013    (CN) .......................... 2013 1 0728578

(51) Int. Cl.
*H01L 27/12* (2006.01)
*G02F 1/1362* (2006.01)

(52) U.S. Cl.
CPC ......... *H01L 27/124* (2013.01); *H01L 27/1244* (2013.01); *H01L 27/1259* (2013.01); *G02F 2001/136254* (2013.01)

(58) Field of Classification Search
CPC ....................... H01L 27/1259; H01L 27/1244
See application file for complete search history.

(56) References Cited

U.S. PATENT DOCUMENTS 6,396,555 B1 * 5/2002 Horie .............................. 349/141
6,515,644 B1 * 2/2003 Kim ................................ 345/87
(Continued)

FOREIGN PATENT DOCUMENTS

| CN | 101443700 A | 5/2000 |
|---|---|---|
| CN | 101443699 A | 5/2009 |
| CN | 102236179 A | 11/2011 |

OTHER PUBLICATIONS

Chinese Office Action dated Oct. 29, 2015, issued to Chinese Application No. 201310728578.4.
(Continued)

*Primary Examiner* — Matthew Landau
*Assistant Examiner* — Grant Withers
(74) *Attorney, Agent, or Firm* — Stein IP, LLC

(57) ABSTRACT

A liquid crystal display array substrate and a method for manufacturing the same are provided herein, wherein, the array substrate comprises, first gate lines, arranged on a substrate in parallel, to transfer a gate signal to a display cell; data lines, arranged on a different layer of the substrate from the first gate line but in a direction perpendicular thereto, to transfer a source driver signal to the cell; buses of common electrode lines forming frame structure and outlet lines extending from the buses; and branches of the common electrode lines intersecting with the buses, wherein, switches are placed at the intersections between the buses and the branches. Such a design can greatly increase the rate of detection of open-circuit failures, so that the failures can be repaired timely, and thus the yield of the display can be increased and the cost be saved.

5 Claims, 5 Drawing Sheets

(56) References Cited

U.S. PATENT DOCUMENTS

| | | | |
|---|---|---|---|
| 6,724,010 B1* | 4/2004 | Kwasnick et al. | 257/59 |
| 7,952,652 B2* | 5/2011 | Gao et al. | 349/43 |
| 8,193,534 B2* | 6/2012 | Zhang | 257/72 |
| 2007/0216821 A1* | 9/2007 | Kim et al. | 349/38 |
| 2009/0096975 A1* | 4/2009 | Kwon et al. | 349/139 |
| 2010/0006838 A1 | 1/2010 | Yoshida et al. | 257/48 |
| 2010/0225609 A1* | 9/2010 | Huang et al. | 345/173 |
| 2010/0238095 A1* | 9/2010 | Zhang | 345/82 |
| 2011/0273640 A1* | 11/2011 | Zhang | G02F 1/1309 349/43 |
| 2012/0104392 A1* | 5/2012 | Son et al. | 257/59 |
| 2013/0093654 A1* | 4/2013 | Park et al. | 345/82 |
| 2013/0146866 A1* | 6/2013 | Kitagawa et al. | 257/43 |
| 2013/0307085 A1* | 11/2013 | Asai et al. | 257/390 |
| 2013/0341624 A1* | 12/2013 | Cho | H01L 29/786 257/57 |
| 2014/0061818 A1* | 3/2014 | Zhang | 257/390 |
| 2014/0117359 A1* | 5/2014 | Yuan et al. | 257/59 |
| 2014/0124800 A1* | 5/2014 | Um et al. | 257/88 |
| 2014/0131718 A1* | 5/2014 | Xue et al. | 257/71 |
| 2014/0138718 A1* | 5/2014 | Liu et al. | 257/88 |
| 2014/0353672 A1* | 12/2014 | Choi et al. | 257/72 |
| 2015/0077680 A1* | 3/2015 | Won et al. | 349/46 |
| 2015/0097163 A1* | 4/2015 | Kanno et al. | 257/40 |
| 2015/0103265 A1* | 4/2015 | Kim et al. | 349/12 |
| 2015/0104937 A1* | 4/2015 | Yan et al. | 438/653 |
| 2015/0108480 A1* | 4/2015 | Xu et al. | 257/59 |
| 2015/0255487 A1* | 9/2015 | Yoshida | G02F 1/1345 257/43 |
| 2015/0286084 A1* | 10/2015 | Yoshida | G02F 1/1345 257/43 |

OTHER PUBLICATIONS

International Search Report dated Sep. 17, 2014, issued to International Application No. PCT/CN2014/070762.

* cited by examiner

The third layer of the substrate

LIQUID CRYSTAL DISPLAY ARRAY SUBSTRATES AND A METHOD FOR MANUFACTURING THE SAME

FIELD OF THE INVENTION

The present disclosure relates to the technical field of liquid crystal display, and particularly, to a liquid crystal display array substrate and a method for manufacturing the same.

BACKGROUND OF THE INVENTION

The liquid crystal display (LCD), especially TFT-LCD, is researched on the most mature among various technology of flat panel display in the present. The liquid crystal display includes an array substrate designed in the form of a matrix, and a driver IC for the array substrate, in which the display effects are thus attained by the deflection of liquid crystal molecules from changes of electric field in a liquid crystal cell.

With the development of semiconductor technology, dimensions of TFT devices becomes increasingly small, and the requirements for the definition of LCD is becoming increasingly high, thus the widths of the metal wires placed therein are required to be as small as possible. However, under the current technology of manufacturing LCD, a risk of smaller wires is short-circuit or open-circuit failure. In the prior art, the detection rate for short-circuit or open-circuit failures of the array substrate is mostly related to the design of the LCD structure. If both ends of each gate line and that of each data line are open, the detection rate of short-circuit or open-circuit failures can be up to 100%. However, if the common electrode lines of the array substrate are in net-shaped structure, it is hard to detect short-circuit or open circuit failures therein. As shown in FIG. 1, the net is formed by a bus (also referred as to Com bus) 101, and several branches (also referred as to Com line) 102 intersecting with the bus at both ends thereof, and outlet lines as indicated by 103 in FIG. 1. Since the voltage at each point of the common electrode lines connected to form the net is substantially the same, it is easy to neglect these failures, especially open-circuit failures, in the process of manufacturing array substrate, and pass them to the subsequent processes of cell-making and module-making. If not repaired timely, the failures may result in some defects to the display such as horizontal light line in display. During cell-making and module-making, the defect of horizontal light line, once occurs, will be hardly repaired and result in discard or degradation of the product.

It is therefore necessary to provide a solution of effectively detecting short-circuit or open-circuit failures, especially the open-circuit failures, in the process of making array substrates.

SUMMARY OF THE INVENTION

With respect to the above-mentioned problem, the present disclosure provides a liquid crystal display array substrate, comprising
first gate lines, arranged on a substrate in parallel, to transfer a gate signal to a display cell;
data lines, arranged on another layer of the substrate in a direction perpendicular to the first gate lines, to transfer a source driver signal to the display cell;
buses of the common electrode lines in a frame structure and outlet lines extending from the buses; and
branches of the common electrode lines intersecting with the buses,
wherein, switches are placed at the intersections between the buses and the branches to make sure that the branches are kept disconnected to the buses in the process of making an array substrate, but connected to the buses during operation of the display, so that the voltage at each point of the branches is the same as that of the buses.

In one embodiment of the present disclosure, the switches comprise TFT thin-film transistors.

In one embodiment of the present disclosure, the gates of the TFT thin-film transistors are connected together to form a second gate line.

In one embodiment of the present disclosure, the second gate line extends in parallel with the outlet lines to a fan-out area, with a second gate line input and a common electrode line input being formed thereon.

In one embodiment of the present disclosure, the second gate line input is connected to the voltage output $V_{gh}$ of an integrated circuit for supplying power on the substrate.

In another aspect of the present disclosure, there is provided a method for manufacturing a liquid crystal display array substrate, comprising the following steps of
forming, on one layer of a substrate, gate lines in parallel;
forming, on another layer of the substrate, data lines in a direction perpendicular to the gate lines;
forming, on a third layer of the substrate, buses of common electrode lines having frame structure, outlet lines extending from the buses, branches of the common electrodes lines intersecting with the buses at each end of the branches, and a switch at each intersection.

According to one embodiment of the present disclosure, the process of configuring switches at each intersection includes the formation of the TFT thin film transistors.

According to one embodiment of the present disclosure, all the gates of the TFT thin-film transistors are connected together to form a second gate line.

According to one embodiment of the present disclosure, the second gate line extends in parallel with one of the common electrode line to a fan-out area, with a second gate line input and a common electrode line input formed thereon.

In one embodiment of the present disclosure, the second gate line input is connected to the voltage output $V_{gh}$ of an integrated circuit for supplying power on the substrate.

Other features and advantages of the present disclosure will be described below in conjunction with the accompanying drawings and embodiments. The objectives of the present disclosure and other advantages can be obtained or achieved by means of the structures or methods as illustrated in detail in the description and claims.

BRIEF DESCRIPTION OF THE DRAWINGS

The present disclosure will be further illustrated in detail below, in combination with the accompanying drawings and specific embodiments, in which.

DETAILED DESCRIPTION OF THE EMBODIMENTS

The implementation of the disclosure is described in detail below through embodiments in combination with the accompanying drawings, so that persons skilled in the art can understand comprehensively about how the present disclosure applies its technical means to solve its problem and thus attain the corresponding technical effects. As long as they do not conflict, each embodiment of the present disclosure and the technical features thereof can be combined with each other, and the technical solutions formed thereby all fall within the scope of the present disclosure.

Figure 1:
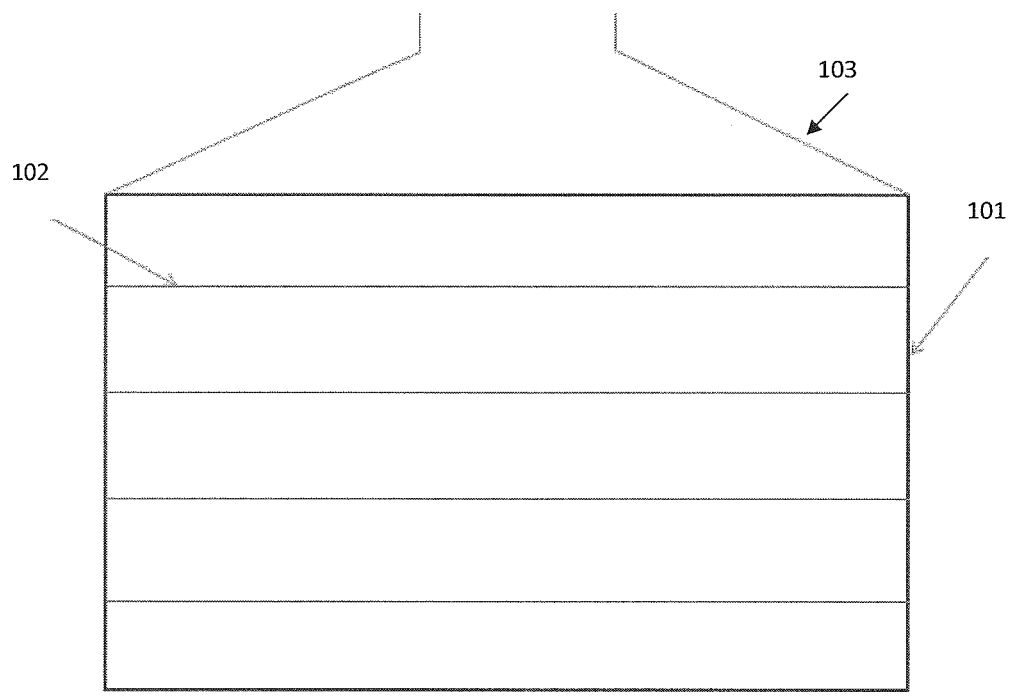
FIG. 1 schematically shows a structure of common electrode lines of a TFT array substrate in the prior art.

In FIG. 1, a traditional structure of common electrode lines of a TFT array substrate is shown. Referring to FIG. 1, the structure is in the shape of a net. Specifically, four common electrode buses 101 form a frame, inside which a plurality of branches 102 are placed in parallel, with both ends of each branch intersecting with the buses. In addition, as shown in FIG. 1, outlet lines 103 extend outward to a fan-out area, and form pins thereon so as to connect with an output of a common electrode driver circuit, to receive a common electrode driver signal there from.

Figure 2:
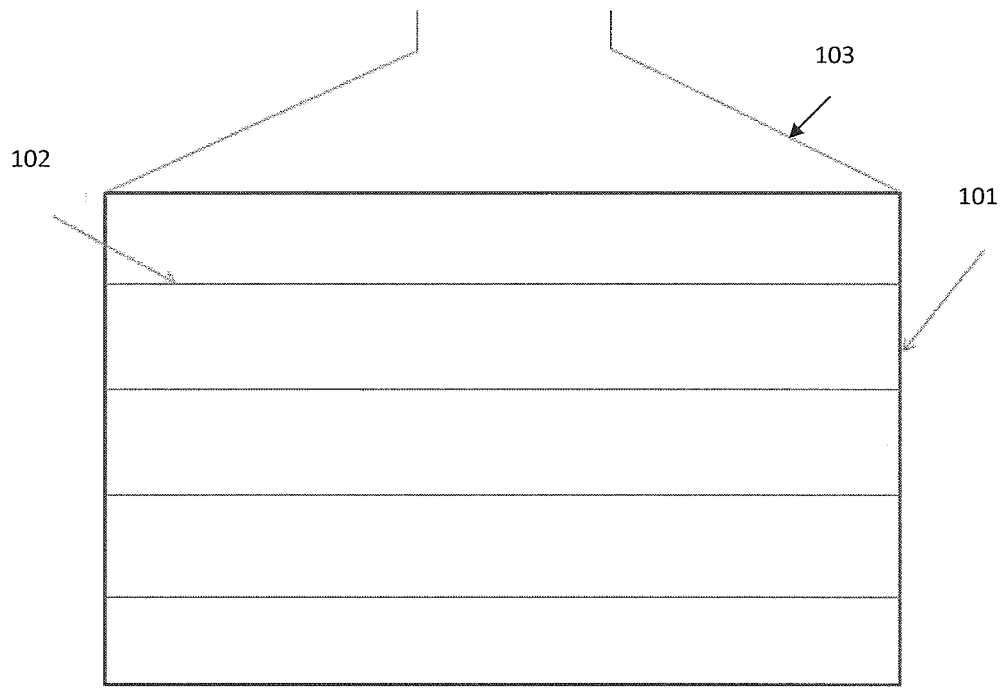
FIG. 2 schematically shows a situation where an open-circuit failure is occurring in the common electrode lines in FIG. 1.

Such structure can avoid the crosstalk phenomenon during driving the display, so that the performance of the liquid crystal display can be improved. However, during the manufacturing of an array substrate with such structure, if an open-circuit failure occurs on a certain branch, such as on the second branch as shown in FIG. 2, the failure can hardly be detected, because the structure of the common electrode lines is in the shape of a net. As described above, once happens, such defects will be neglected and passed to the subsequent processes, i.e., the liquid crystal display cell making process and the module assembly process, during which the defects cannot be repaired.

Figure 3A:
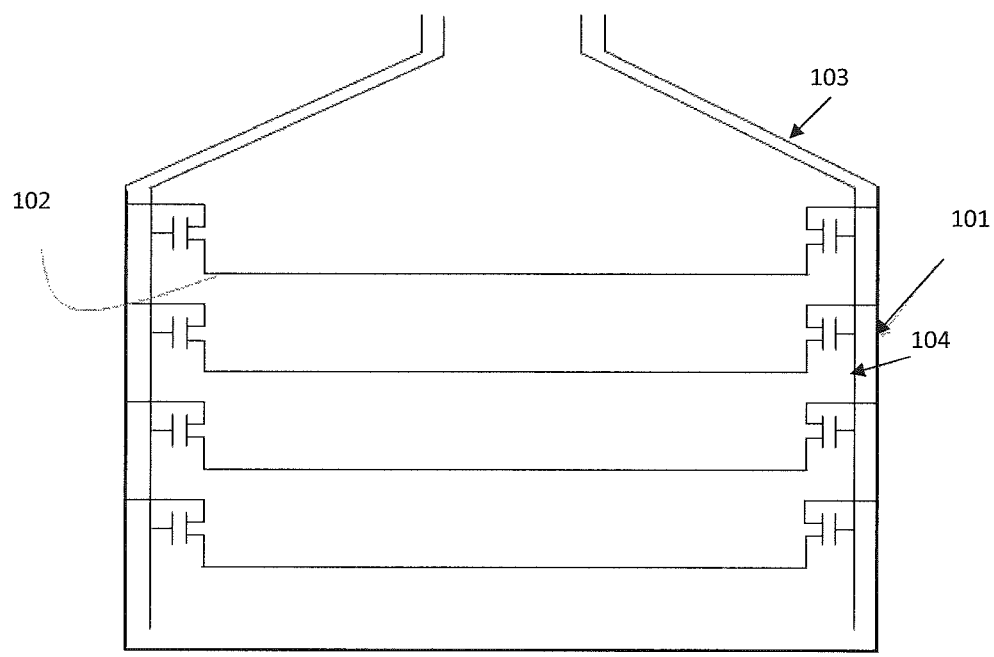
FIGS. 3A and 3B schematically shows a structure of the common electrode lines of the TFT array substrate according to one embodiment of the present disclosure, with FIG. 3A showing the third layer of the substrate and FIG. 3B showing the first and second layers of the substrate.
Figure 3B:
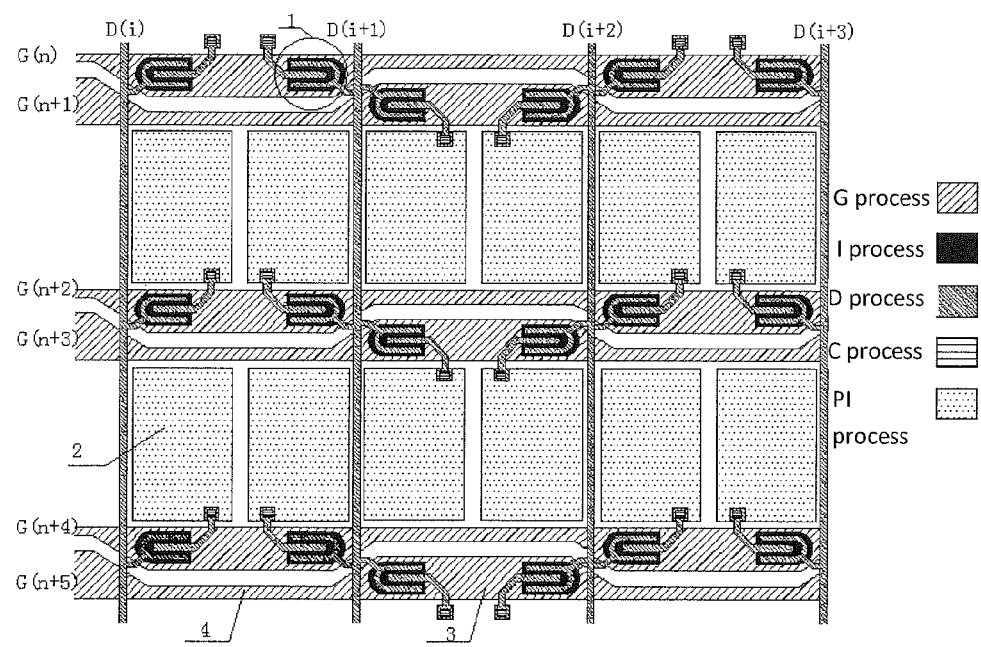

As shown in FIGS. 3A and 3B, there is provided a kind of structure for common electrodes according to the present disclosure. FIG. 3A shows the third layer of the array substrate and FIG. 3B shows the first and second layers of the substrate. The outlet lines 103 extend from the common electrode buses and form preferably the shape of a bell mouth or an inverted funnel. The adoption of such a structure is to adapt to the design of the common electrode driver circuit. As matter of fact, it is also feasible for the outlet lines to form other shape according to practical situation.

In FIGS. 3A and 3B, the common electrode branches 102 intersect with the buses 101, wherein, switch elements are placed at the intersections between the branches and buses. In one embodiment of the present disclosure, the switch elements are TFT thin film transistors. However, the present disclosure is not limited to the above mentioned switch elements. Any switch elements can be used, as long as they have the functions of keeping the branches 102 disconnected to the buses 101 in the process of making the array substrate, and keeping the branches 102 electrically connected to the buses 101 during the operation of the liquid crystal display, so that the voltage at each point of the branches 102 is the same or substantially the same as that of the buses 101.

Therefore, the array substrate adopting the above structure of the common electrode lines comprises:

first gate lines, which are not shown for the simplicity of the present disclosure, arranged on a substrate in parallel, to transfer a gate signal to a display cell;

data lines, which are not shown for the simplicity of the present disclosure, arranged on a different layer of the substrate from the first gate lines but in a direction perpendicular thereto, to transfer a source driver signal to the cell;

buses 101 of the common electrode lines in frame structure, and outlet lines 103 extending from the buses; and branches 102 of the common electrodes lines intersecting with the buses, wherein, switches are placed at the intersections between the buses and the branches.

In order not to obscure the principle of the present disclosure, other essential elements consisting of the array substrate are not shown or described herein, since they are already well known to persons skilled in the art.

Then, still referring to FIGS. 3A and 3B, gate lines of TFT thin film transistors of the array substrate acting as switch elements are connected together to form a second gate line 104. Sources or drains of the TFT transistors are respectively connected to the buses 101 or the branches 102. In addition, preferably, the second gate line 104 extends in parallel with the outlet lines 103 of the common electrode lines to a fan-out area, with a second gate line input and a common electrode line input being formed thereon, which means two pins are added on the fan-out area, so as to connect to the second gate line 104 and the outlet line 103.

In one embodiment, the frame formed by the common electrode buses is in a shape of a frame composed of three buses with an opening on the top, instead of four buses.

During operation of the liquid crystal display, when setting a Com drive input voltage, a high DC voltage is applied to the input of the second gate line, so as to produce mesh currents between the data lines and gate lines via the common electrode network of the present disclosure. Preferably, the input of the second gate line can be directly connected to the voltage output $V_{gh}$ of Power IC for supplying power on the array substrate. Such a design can attain the same effect as net-shaped common electrodes, without any extra element.

Figure 4:
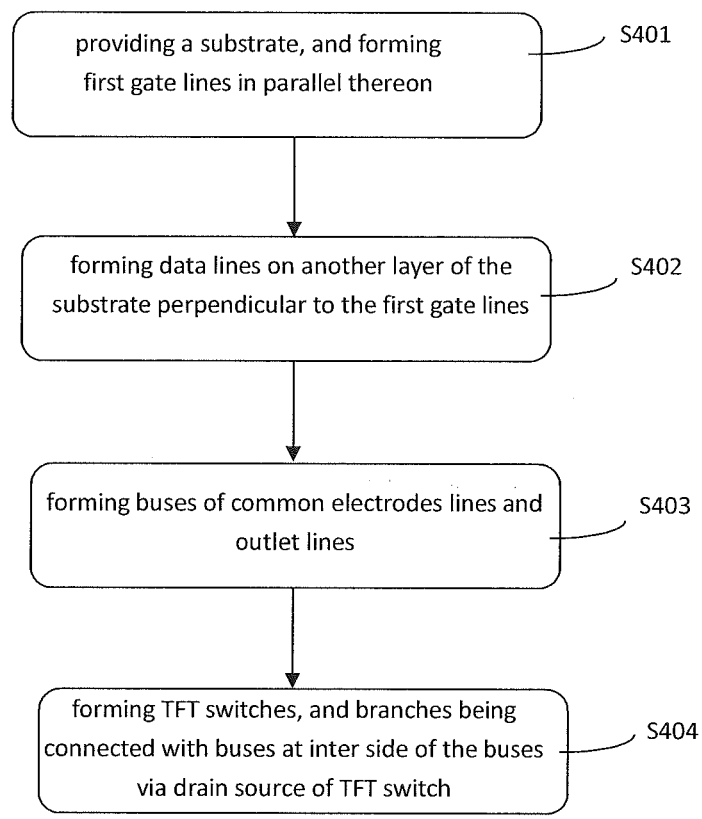
FIG. 4 shows a flow chart showing a method of manufacturing the TFT array substrate according to one embodiment of the present disclosure.

FIG. 4 is a flowchart of a method for manufacturing the array substrate of the liquid crystal display according to the principle of the present disclosure. The method comprises the following steps of:

S401, forming, on one layer of a substrate, gate lines in parallel;

S402, forming, on another layer of the substrate, data lines in a direction perpendicular to the gate lines;

S403, forming, on a third layer of the substrate, buses of common electrodes lines in frame structure, and outlet lines extending from the buses, wherein.

S404, forming branches of the common electrode lines intersecting with the buses at inter side of each branch, and switches at each intersection.

According to one embodiment of the present disclosure, the step of forming switches at each intersection includes forming TFT thin film transistors. The branches are connected to the buses of the net-shaped common electrodes via the drain and source electrodes of the TFT switches.

In one embodiment of the present disclosure, all the gates of the TFT thin-film transistors are connected together to form a second gate line.

In one embodiment of the present disclosure, the second gate line extends in parallel with one of the common electrode lines to a fan-out area, with an input of the second gate line and an input of the common electrode lines formed thereon.

In one embodiment of the present disclosure, the second gate line input is connected to the voltage output $V_{gh}$ of an integrated circuit for supplying power on the substrate.

In one embodiment of the present disclosure, the common electrodes buses having a frame structure consist of three buses, so as to form a frame with an opening on the top.

The foregoing are merely preferred specific embodiments, but the present disclosure is not limited to this. Any changes or modifications made by persons skilled in the art will fall within the scope of the present disclosure. Accordingly, the scope of the present disclosure will be defined in the accompanying claims.

The invention claimed is:

1. A method for manufacturing a liquid crystal display array substrate, comprising the following steps of:
   forming, on one layer of a substrate, gate lines in parallel;
   forming, on another layer of the substrate, data lines in a direction perpendicular to the gate lines; and
   forming, on a third layer of the substrate, buses of common electrode lines in frame structure, outlet lines extending from the buses, branches of the common electrode lines intersecting with the buses at either side of the buses, and a switch at each intersection.

2. The method for manufacturing a liquid crystal display array substrate as recited in claim 1, wherein the step of forming the switch at each intersection includes forming TFT thin film transistors.

3. The method for manufacturing a liquid crystal display array substrate as recited in claim 2, wherein gates of the TFT thin-film transistors are connected together to form a second gate line.

4. The method for manufacturing a liquid crystal display array substrate as recited in claim 3, wherein the second gate line extends in parallel with one of the common electrode lines to a fan-out area, with a second gate line input and a common electrode line input formed thereon.

5. The method for manufacturing a liquid crystal display array substrate as recited in claim 4, wherein the second gate line input is connected to the voltage output $V_{gh}$ of an integrated circuit for supplying power on the substrate.

* * * * *